April 26, 1960 L. E. BRISTOL ET AL 2,934,627

ELECTRIC PRINTED CIRCUIT COMPONENT

Filed April 9, 1957

INVENTORS
Lorne E. Bristol
William M. Porter

By Herbert E. Metcalf
Their Patent Attorney 2,934,627

ELECTRIC PRINTED CIRCUIT COMPONENT

Lorne E. Bristol, Hermosa Beach, and William M. Porter, Gardena, Calif., assignors to Northrop Corporation, a corporation of California Application April 9, 1957, Serial No. 651,600

3 Claims. (Cl. 200—135)

This invention relates to printed circuit components and more particularly to a plug-type component having a printed circuit processed on at least one outer surface thereof and in which the printed circuit is further characterized by including fusible portions.

Although printed circuits per se are not new it is only in recent years that they have been utilized extensively to replace conventional type circuits. This is particularly true in connection with apparatus and installations employing electronic components. In this respect engineering and production personnel have been quick to recognize the innumerable advantages to be gained by the use of printed circuit techniques.

Of the many advantages of printed circuits as referred to above, most of which are well known and recognized by those skilled in the art, unquestionably one of the foremost is their inherent space saving characteristics. However, to the best of applicants' knowledge a printed circuit incorporating one or more fusible elements, providing not only the aforementioned space saving advantage but also providing other novel and unique features and advantages, has never been utilized. The other novel and unique features of applicants' printed circuit component as referred to above will become apparent as the disclosure progresses.

Accordingly it is an object of the present invention to provide an electric circuit component of the printed circuit type which will function as a fuse element.

Another object is to provide an electric circuit component of the printed circuit type which includes a plurality of fusible portions which may be positioned in extremely close proximity due to the inherent characteristics of the component.

Another object is to provide an electric circuit component of the printed circuit type which includes a plurality of fusible portions and in which a plurality of the components may be mounted in a unitary container without danger of one component malfunctioning while another component is functioning.

Another object is to provide an electric circuit component of the printed circuit type which includes a plurality of fusible portions and which is vibration, shatter and explosion proof, which is quickly and easily replaceable, which is economical to manufacture to extremely close tolerances and resistances, and which may be easily adapted to any purposes for which it is intended.

Although the characteristic features of the present invention are particularly pointed out in the appended claims, the invention itself, also the manner in which it may be carried out, will be better understood by referring to the following description taken in connection with the accompanying drawings forming a part of this application and in which:

Figure 1:
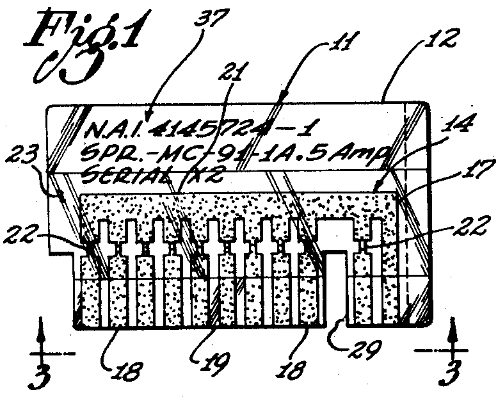
Figures 1 and 2 are elevational views of the respective sides of the electric circuit component as disclosed herein.
Figure 2:
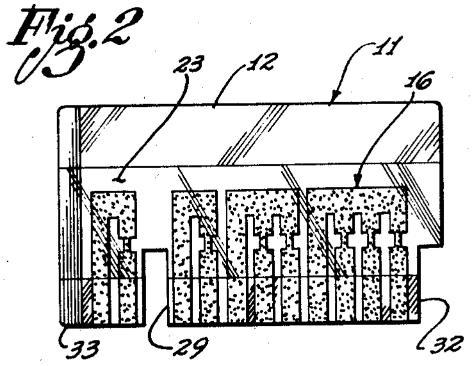
Figure 3:
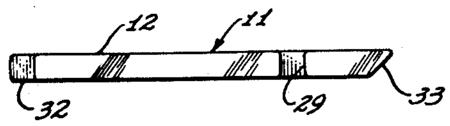
Figure 3 is a bottom view of the electric circuit component viewed as indicated by the arrows 3—3 in Figure 1.

Referring to the drawings, Figures 1–3 show an electric circuit component 11 of the printed circuit type as disclosed herein. The term "printed circuits" as used throughout this specification refers to circuits which are processed on the surface of a dielectric material by any process, for example by painting, spraying, chemical deposition, etc.

The component 11 consists of a rectangular plate-like element 12 having printed circuits processed on each side surface thereof and which are indicated in general by the numerals 14 and 16. An element similar to the element 12 normally is fabricated from any suitable material having a high dielectric constant, however, in the present embodiment the element is also constructed of a material having good heat absorbing characteristics for reasons which will become apparent as the disclosure progresses. Satisfactory materials from which the element 12 may be fabricated include steatite, ceramic and plastic plate, Pyrex glass, etc.

The printed circuit 14 includes a common lead or conductor 17 and a plurality of individual leads 18. All of the leads 17 and 18 originate at and extend in a normal direction with respect to the lower edge 19 of the element 12. All of the individual leads 18 junction with a horizontal portion 21 of the common lead 17 substantially as shown in Figure 1. Thus it will be apparent that one side of an electrical circuit or circuits may contact the lead 17 and the other side of the circuits attached to respective ones of the individual leads 18 to provide a plurality of flow paths for electric current through the circuit 14.

The specific arrangement of the leads 17 and 18, as shown in Figure 1, is merely illustrative and it is to be understood that they may assume various configurations. For example, the arrangement of the leads may be similar to that appearing on the reverse side of the element 12 as shown in Figure 2. In this respect, however, it will be noted that all leads originate at the edge 19 and extend therefrom in parallel relation. This arrangement insures that all leads will make proper electrical contact at such times as the element 12 is properly inserted in a receptacle as described presently.

Each of the individual leads 18 is constructed of a fusible material and each is reduced in cross-section near its terminal end adjacent its juncture with the horizontal portion 21 of the lead 17 as indicated at 22 and as shown in Figure 1. Due to the inherent nature of printed circuits it is possible to construct and therefore calibrate the portions 22 to very exacting limitations. The portions 22 therefore constitute a plurality of fuse elements which will "blow" when one of the aforementioned flow paths, defined by the lead 17 and one of the individual leads 18, are subject to current flow exceeding that which they are calibrated to carry. Protection of the printed circuits 14 and 16 against abrasion, humidity, etc. is provided by a resin coating 23 applied over the circuits except their lower ends which are uncoated for contact purposes. Suitable protective coatings 23 include: silicone resin in toluene, polyvinyl acetate, chloride lacquer, etc.

Referring to Figures 1 and 2 it will be seen that the individual leads 18 are positioned extremely close together. This is possible because of the heat absorbing qualities of the element 12. By referring to Figure 3 it will also be seen the element 12 is fairly thick and inasmuch as the leads 18 are practically integral with the element 12 and exceptionally good heat exchange relation of high capacity exists. This unique feature permits the individiual leads 18 to be positioned in exceedingly close side to side relation, in fact they need to be spaced apart only sufficiently to maintain the identity of the aforementioned individual flow paths.

In view of the foregoing explanation it will be seen that as one of the portions 22 "blow" the heat generated thereby will be efficiently conducted into the element 12 and dissipated therefrom without adversely effecting an adjacent portion 22. The close arrangement of the leads 18, resulting in a great saving in space and weight together with other advantages, would be impossible to achieve with currently known wire type fuse elements.

Figure 4:
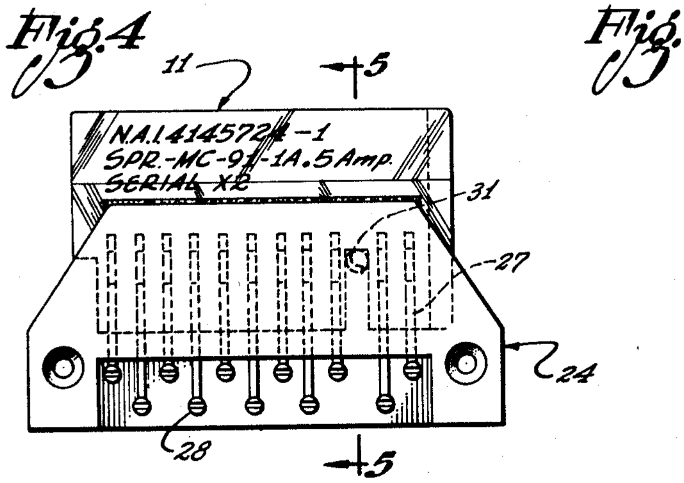
Figure 4 is a side elevational view of the electric circuit component of Figure 1 mounted in a typical receptacle.
Figure 5:
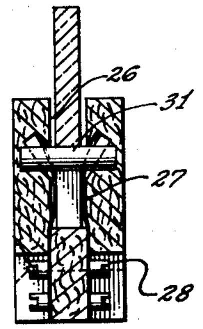
Figure 5 is a cross-sectional view of the component and receptacle of Figure 4 as viewed along the line 5—5 thereof.

In practical applications the component 11 is received in a slot 26 of a receptacle 24 substantially as shown in Figures 4 and 5. As positioned in the receptacle 24 it will be apparent that the spring members 27, which are also attached to the connectors 28, contact the leads 17 and 18 to provide electric flow paths through the receptacle 24 and component 11. It will also be understood that similar electric flow paths are provided through the receptacle 24 and circuits 16. A slot 29 cooperates with a pin 31 positioned in the receptacle 24 to insure that the component 11 is properly positioned in the receptacle in which the leads 17 and 18 are properly aligned with respective ones of the spring members 27. A notch 32 or a tapered end 33 may also be provided in the component 11 to insure the proper positioning of the latter in other but similar types of receptacles (not shown).

Figure 6:
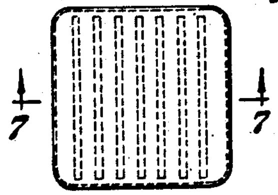
Figure 6 is a plan view of a package or container assembly in which a plurality of the components as shown in Figures 1–3 are mounted.
Figure 7:
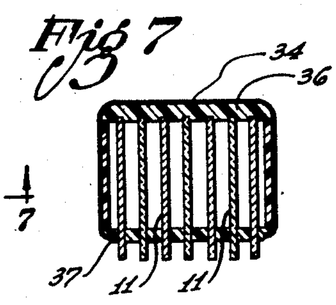
Figure 7 is a cross-sectional view of the assembly of Figure 6 as viewed along the line 7–7 thereof.

Figures 6 and 7 show a plurality of the components 11 mounted in adjacent parallel relationship in a metal container 34 which is lined with a phenolic material 36. It will be noticed that the lower ends of components 11, as viewed in Figure 7, extend from the container 34 and provide means whereby the components 11 may be received in electrical contact in a multiple receptacle (not shown). As mounted the individual components 11 are sealed in the base 37 of the container rendering the latter fluid tight. Thus it will be seen that a far greater number of fusible elements may be mounted in a single hermetically sealed container than would be possible if conventional type fuses were utilized. Due to the infrangible and fluid tight characteristics of the container 34, the latter carrying a plurality of the components 11, may be utilized in an inflammable gaseous environment without danger of igniting the gas as the portions 22 "blow." In this respect should it be possible to mount conventional type fuses in the close proximity as disclosed by applicant, either in Figure 1 or 6, adjacent fuse elements would be melted at such time as one fuse element "blows." This would not be the case in connection with applicants' components 11 and in addition they provide great savings both in space and weightwise.

Applicants' components 11 having been described in detail, its usefulness and many advantages will be better understood by the following explanation of practical applications.

For example, a single component 11 may be utilized to replace all fuse elements positioned at various locations in a radio or television circuits or the like. Thus by checking at a single location it is possible to determine if any of the portions 22 have "blown" and accordingly whether or not all circuits are operational fusewise. The component 11 would centralize all fuse members at a readily accessible location.

However, a far greater application of the components 11 is to be found in electronic circuits as they pertain to aircraft and guided missiles. Assuming that a guided missile is to be launched from an aircraft, prior to a tactical launching it is necessary to check the innumerable electrical circuits extending between the aircraft and missile. Also during pre-tactical check-out operations the aforementioned innumerable electrical circuits flow through respective ones of the leads 18 and therefore each one of the leads is identified with a respective individual circuit. Inasmuch as the portions 22 are carefully calibrated to a predetermined rating each respective portion 22 will "blow" as each one of the individual circuits is energized if it is functioning properly. The components 11 are subsequently removed from their respective receptacle and examined. If one or more of the portions 22 have not "blown" it will be obvious that these circuits are not functioning properly and corrective steps may be taken.

In addition to the information provided immediately by inspecting the components 11 still further advantages are forthcoming. Each of the components 11 carries identifying marks as indicated at 37 in Figure 1. Accordingly the components may be filed away for future reference. If this procedure is not advisable the information secured from the components 11 may be transferred to punched-type cards. Thus the performance record of any electronic circuit may be accurately maintained over any period of time. The importance of means to obtain this type of record and maintain it will be recognized if the responsibility of checking several squadrons of missile equipped aircraft is assigned to one command. For example, an electrical circuit need not necessarily fail each time it is intended to be energized, rather it may fail only once or twice while operating satisfactorily the remainder of the time. Such a circuit, however, is faulty and may fail during a critical operation. If a record as described above is available the faulty circuit, whether it fails continuously or only occasionally, may be pinpointed and corrected. If such a record is not available the occasional circuit malfunction will probably not be discovered and if discovered can only be corrected by guess work in a hit and miss manner.

While in order to comply with the statute, the invention has been described in language more or less specific as to structural features, it is to be understood that the invention is not limited to the specific features shown, but that the means and construction herein disclosed comprise a preferred form of putting the invention into effect, and the invention is therefore claimed in any of its forms or modifications within the legitimate and valid scope of the appended claims.

What is claimed is:

1. An electric circuit component assembly comprising: a container; a plurality of plate-like members fabricated of dielectric material; said plate-like members being mounted in said container in spaced parallel relation with major portions thereof located inside said container and corresponding edges thereof extending through and beyond a wall of said container in sealed relation to render said container fluid tight; printed circuit means which includes a plurality of printed-type electrical connectors processed on both sides of each of said plate-like members to define a plurality of flow paths for electric current; said plurality of connectors originating and terminating adjacent said corresponding edges; and said plurality of connectors each including an intermediate portion located inside said container which has a predetermined current carrying capacity which is less than the current carrying capacity of the remainder of the connector in which said intermediate portion is located.

2. An electrical component as set forth in claim 1:

further characterized in that a notch is provided in said one edge and is located off-center with respect to a reference line located mid-way between the edges of said member which are normal to said one edge.

3. An electric circuit component, comprising: a plate-like member of rectangular configuration fabricated of a dielectric material; a plurality of printed-type electric connectors each of which consists of a fusible material processed on the side surfaces of said member to define a plurality of flow paths for electric current; said plurality of connectors originating and terminating at one edge of said member and extending a predetermined distance therefrom in a direction normal to said one edge, one of the edges of said member which is normal to said one edge wedge shaped in cross section; and each of said plurality of connectors includes an intermediate portion which has a predetermined current carrying capacity which is less than the current carrying capacity of the remainder of the connector in which said intermediate portion is located.

References Cited in the file of this patent

UNITED STATES PATENTS

| | | |
|---|---|---|
| 545,670 | Brittin | Sept. 3, 1895 |
| 1,060,617 | Murray | May 6, 1913 |
| 1,079,018 | Murray | Nov. 18, 1913 |
| 1,644,626 | Barklie | Oct. 4, 1927 |
| 1,914,871 | Siampos | June 20, 1933 |
| 2,102,206 | Holmes | Dec. 14, 1937 |
| 2,263,752 | Babler | Nov. 25, 1941 |
| 2,863,021 | Green | Dec. 2, 1958 |
| 2,864,917 | Sundt | Dec. 16, 1958 |

FOREIGN PATENTS

| | | |
|---|---|---|
| 265,263 | Great Britain | Feb. 7, 1927 |
| 319,034 | Great Britain | Sept. 16, 1929 |
| 499,816 | Great Britain | Jan. 26, 1939 |